United States Patent [19]

Shiba et al.

[11] 4,347,305
[45] Aug. 31, 1982

[54] PHOTOSENSITIVE LITHOGRAPHIC PRINTING PLATE PRECURSORS AND METHODS OF PREPARING PRINTING PLATE THEREFROM

[75] Inventors: Keisuke Shiba; Tadao Toyama, both of Shizuoka, Japan

[73] Assignee: Fuji Photo Film Co., Ltd., Kanagawa, Japan

[21] Appl. No.: 198,999

[22] Filed: Oct. 21, 1980

[30] Foreign Application Priority Data

Oct. 23, 1979 [JP] Japan .................................. 54-136729

[51] Int. Cl.$^3$ .............................................. G03F 7/02
[52] U.S. Cl. .................................... 430/302; 430/271; 430/273; 430/156
[58] Field of Search ............... 430/302, 271, 273, 156, 430/264, 409, 410

[56] References Cited

U.S. PATENT DOCUMENTS 3,317,322   5/1967   Porter et al. ........................ 430/567
4,168,167   9/1979   Takenaka et al. .................... 430/264

FOREIGN PATENT DOCUMENTS 645877   11/1950   United Kingdom ................ 430/409
1227603   4/1971   United Kingdom ................ 430/156

*Primary Examiner*—Won H. Louie, Jr.
*Attorney, Agent, or Firm*—Sughrue, Mion, Zinn, Macpeak & Seas

[57] ABSTRACT

A photosensitive lithographic printing plate precursor which has a camera speed together with all the advantageous features inherent to positive type, conventional PS plates is disclosed. On an aluminum support having a hydrophilic surface, one provides first a positive type non-silver photosensitive layer capable of forming an oleophilic image, and then superposes thereon an unfogged positive type internally sensitized silver halide photographic emulsion coating.

10 Claims, No Drawings

PHOTOSENSITIVE LITHOGRAPHIC PRINTING PLATE PRECURSORS AND METHODS OF PREPARING PRINTING PLATE THEREFROM

BACKGROUND OF THE INVENTION

1. Field of the Invention

This invention relates to a photosensitive lithographic printing plate precursor making use of the high sensitivity to light of silver halide and also to a method of printing master preparation using such precursors. More specifically, the present invention relates to a high speed photosensitive lithographic printing plate precursor of the positive working type and to a method of preparing a printing plate therefrom.

2. Description of the Prior Art

There are a variety of well known positive type photosensitive lithographic printing plate precursors including silver halide as an emulsion layer as described in, for example, U.S. Pat. Nos. 3,083,097, 3,161,508, 3,721,559 and 3,146,104, etc. However, most of these suffer from various disadvantages including a low degree of printing durability, a high probability of staining, insufficient oleophilicity in the image areas, etc.

On the other hand, British Pat. No. 1,227,603, U.S. Pat. No. 3,245,793, U.S. Defensive Publication T870,022, German Patent Application (OLS) Nos. 2,517,711 and 2,646,763, U.S. Pat. No. 3,567,445, etc., describe photosensitive lithographic printing plate precursors in which the non-silver photosensitive layer which typically is used in the conventional PS plate is overcoated with a silver halide emulsion layer. Moreover, as the first British Patent cited above mentions that electrophotographic processes or a silver halide diffusion transfer process (hereafter abbreviated DTR process) can also be used to provide a masking image which prevents active light from reaching the positive type non-silver photosensitive layer. However, electrophotographic processes are complicated and the reproduced image lacks stability in comparison to that obtained with PS plates. On the other hand, a DTR process suffers from its complicated processing steps.

U.S. Pat. No. 4,168,167 discloses a positive type PS plate utilizing a photosensitive coating containing unfogged and internally sensitized silver halide grains provided on an aluminum support. The lithographic printing plate prepared from this precursor still needs improvement for a tendency to smudge in non-image areas, for ink receptivity in image areas, tone reproduction capability, etc.

Furthermore, as the above-cited U.S. Pat. No. 3,567,445 sets forth, one can produce a positive type PS plate by superimposing a conventional negative type silver halide coating on a conventionally known negative type non-silver photosensitive layer. However, in such a combination, one must recall that most of the photosensitive materials used in a negative type non-silver photosensitive layer (e.g., diazonium compounds) tend to adversely affect the photographic properties of the silver halide grains. In the case of a photopolymerizable monomer or photo-crosslinkable oligomer type PS material, another disadvantage is that an organic solvent must be used at development. Accordingly, intricate manufacturing operations and relatively high manufacturing costs are inevitable, and the cost of printing plate preparation tends to increase.

SUMMARY OF THE INVENTION

In view of the present technology, the inventors have found, as a result of an extensive study, that a specific combination of a certain type of non-silver photosensitive layer and a certain type of silver halide emulsion can markedly improve the conventional technology. Thus, the present invention provides a photosensitive lithographic printing plate precursor comprising an aluminum support having a hydrophilic surface, (a) a positive type non-silver photosensitive layer capable of providing an oleophilic image or a layer comprising a water-insoluble, oleophilic resinous material, and (b) a photographic silver halide emulsion coating, these two coatings (a) and (b) being superimposed on the support in that order, characterized in that the silver halide emulsion is an unfogged internally sensitized emulsion and further the emulsion does not contain any tanning developing agent.

In accordance with the present invention, positive working images having good image quality and durability are formed in a PS material using an internally sensitized silver halide emulsion layer. The exposed and developed emulsion layer forms an image which acts as a resist image or an optical mask depending on whether the layer underlying the image is a layer of a non-sensitive oleophilic resinous material in accordance with one embodiment of the present invention, or a positive-type photosensitive layer in accordance with another embodiment of the invention. Where the photosensitive lithographic plate of the invention comprises a non-sensitive oleophilic resinous material, the silver halide emulsion layer is tanning developed to provide a resist image and the unprotected regions of the oleophilic resin-containing layer are eliminated with a suitable solvent to expose the hydrophilic surface of the aluminum support. In the other embodiment of the invention, a positive-type photosensitive layer is employed under the silver halide emulsion layer and a silver image is formed in the emulsion layer, which acts as an optical mask through which the underlying photosensitive layer is exposed. The photosensitive layer is developed to uncover the aluminum support in the areas not masked by the silver image.

DETAILED DESCRIPTION OF THE INVENTION

Generally speaking, the latent image distribution in an individual silver halide grain involved in image recording is controlled depending on the purpose of the finished product. In the case of high-speed negative film for ordinary photographic use, the latent image is located at the surface. Such a silver halide grain is designated as a surface sensitized grain. On the other hand, internally sensitized grains are also possible which form latent images predominantly inside the crystals without giving rise to surface latent images. In the past, internally sensitized silver halide grains have been said to be made of chemically unsensitized, relatively low-speed crystals. The internally sensitized grains used in the present invention exhibit sufficiently high photographic speed from practical viewpoint and can be specially prepared. For example, one can prepare such grains by covering chemically sensitized grains with silver halide or performing such surface covering with conversion of grain surface to different silver halide as described in U.S. Pat. No. 3,622,318 and British Pat. No. 635,841, or by forming deactivating sensitivity speck at grain surface by oxidation, etc.

The present invention is characterized by the use of silver halide photographic emulsions which are internally sensitized and unfogged. The term "internally sensitized type" as used in this specification means emulsions containing silver halide grains capable of predominantly giving rise to internal latent images by image exposure, and conforming to the definition set forth in British Pat. No. 1,385,039 (page 2, lines 65-98). In order to identify an internally sensitized emulsion, one prepares two strips coated with the emulsion using a common exposure conditions. One of the strips is processed with surface developer X, while the other is processed with internal developer Y, and both are fixed at 20° C. for 6 minutes. If the maximum density $D_{max}$ obtained by internal developer Y exceeds that obtained by surface developer X by a factor of 2 or more, or if the photographic speed realized by internal developer Y is at least 5 times as great as that with surface developer X, then the emulsion is an internally sensitized emulsion. (Developers X and Y are employed for identifying the silver halide only. They are not the developers preferred for use in the present invention.)

| Internal Developer Y | |
| --- | --- |
| Metol (N-methyl-p-aminophenol sulfate) | 2.0 g |
| Hydroquinone | 8.0 g |
| Sodium Sulfite (anhydrous) | 90 g |
| Sodium Carbonate (monohydrate) | 52.5 g |
| Potassium Bromide | 5.0 g |
| Potassium Iodide | 0.5 g |
| Water to make | 1,000 ml |
| Surface Developer X | |
| Metol (N-methyl-p-aminophenol sulfate) | 2.5 g |
| Ascorbic Acid | 10.0 g |
| Borax | 35.0 g |
| Potassium Bromide | 1.0 g |
| Fixer | |
| Sodium Thiosulfate | 150 g |
| Sodium Sulfite | 10 g |
| Water to make | 1,000 ml |

The internally sensitized silver halide emulsion used in the present invention can be obtained by any of the following methods: under such conditions as to suppress surface sensitization, defects are introduced in the crystal structure itself, or the grains are chemically sensitized during the course of physical ripening. Further, foreign metal ions such as, for example, rhodium ion, iridium ion, etc., are doped in the internal part of the crystal, or crystals once formed are converted by making use of the difference in the solubility product of silver salts. Such methods are described in detail in U.S. Pat. Nos. 3,317,322 and 3,761,276. The resulting emulsion can provide a positive silver image directly from a positive original when processed with a surface developer in the presence of a fogging agent. The average grain size for the silver halide is preferably about 0.1 to 5 microns, and in particular about 0.5 to 2 microns. The silver halide grains can be spectrally sensitized. One can further incorporate in the emulsion additives such as mercapto compounds, triazole compounds, etc.

In order to fog the emulsion upon development, various compounds can be used including fogging agent precursors. Representative examples are described in U.S. Pat. Nos. 2,588,982, 3,227,552, 3,615,615, 3,719,494 and 3,734,738, etc. Specific examples include the following compounds: 2-methyl-3-[3-(p-sulfophenylhydrazine)propyl]benzothiazolium bromide, 2-methyl-3-($\beta$-hydroxyethyl)benzothiazolium bromide, p-methanesulfonamideethylphenylhydrazine, 1,2-dihydro-3-methyl-4-phenylpyrido[2,1-b]benzothiazolium bromide, etc. Precursors such as 3-(2-acetylethyl)-2-benzylbenzoselenazolium bromide, etc., can be present in the emulsion layer. These fogging agents are preferably incorporated into the silver halide emulsion in an amount of about 100 mg to about 1,500 mg per mol of silver in the silver halide emulsion.

Grain formation of silver halide can be performed in a binder such as gelatin, gelatin derivatives, polyvinylpyrrolidone, acrylamide containing polymers, cellulose derivatives, etc., which are used as the binder for the emulsion layer. In one embodiment of the present invention, one can use polymers that are tanning developable by the oxidation product (having a quinone form) of the developing agent.

A suitable coating weight for the emulsion is from 0.1 to 10 g/m².

Where the surface developer works also as tanning developer, it has been surprisingly found that the fogging development used in the present invention provides not only a high quality positive image with perfectly clear highlight areas, but that the coexistent of the fogging agent precursor also promote the function of tanning.

The internally sensitized silver halide photographic emulsion prepared in accordance with the present invention is not fogged prior to image exposure. As described in, for example, *The Theory of the Photographic Process* by C. E. K. Mees and T. H. James (Macmillan Co., third Edition), positive images can be directly reproduced from positive originals using an internally sensitized emulsion which has been found prior to image exposure. Furthermore, it is well known to those skilled in the art that such emulsions can be applied in the preparation of printing plates as taught, for example, in Japanese Patent Application (OPI) No. 15502/74 (the term "OPI" as used herein refers to a "published unexamined Japanese patent application"). It is emphasized that this type of emulsion is based on an entirely different imaging mechanism, lacking high photographic speed and suffering from a low degree of highlight clearness as well as a poor shelf life and is not used in the present invention. In accordance with the present invention, the internally sensitized emulsion is the type not fogged prior to exposure.

In a particularly preferred embodiment of the present invention, the internally sensitized silver halide emulsion coating described in detail hereinbefore contains a substantially water-insoluble, oleophilic resinous material in a finely dispersed state.

An "oleophilic resin" is one which, when applied to a support in a thickness of about 2 microns or more (the caoted support is referred to as a specimen), the surface of the resin layer forms a substantially positive angle of contact with the support. As taught by Mitsuo Obana in *Wetting on a Lithographic Printing PLate*, Insatsu Zasshi (Journal of Printing), Vol. 25, October issue, 1968, and by A. W. Adamson, *Physical Chemistry of Surfaces*, John Wiley & Sons, Inc., (1967), pp. 342-344, the angle of contact is defined as $\theta = -[\theta o/w - \theta w/o]$ wherein $\theta o/w$ is the angle of contact of kerosine in water as measured with a goniometer by the "captive bubble method" wherein fine particles (bubbles) of kerosine are brought into contact with the surface of the specimen immersed in water at 24° C., and $\theta w/o$ is the angle of contact of water in kerosine as measured with a goniometer likewise bringing fine particles (bubbles) of water into contact with the surface of the specimen immersed in kerosine. Examples of such substantially water-insoluble oleophilic resins are such as shellac, polyamide resins, phenolic resins, polyvinyl acetal resins, linear polyurethane resins, phenolic novolak resins and polyester resins. Besides these resins, polyvinyl cinnamate resins and photosensitive polymers such as photosensitive polyesters can also be used. The following resins A, B and C are particularly preferred.

A: Resins having a repeating unit of the following formula (I):

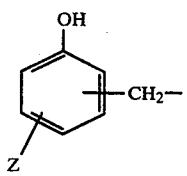

wherein Z is a hydrogen atom, a halogen atom, an alkyl group having 1 to 4 carbon atoms, an alkoxy group having 1 to 4 carbon atoms, or a carboxyl group.

B: Resins formed by polycondensation of polyvalent unsubstituted phenol and ketone having 3 to 5 carbon atoms.

C: Resins having a repeating unit of the following formula (II):

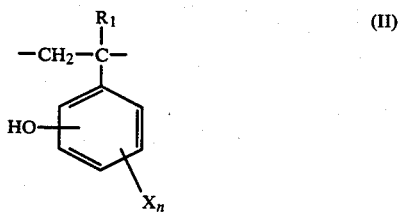

wherein $R_1$ is a hydrogen atom or an alkyl group having 1 to 4 carbon atoms; X is a halogen atom; n is 1 or 2.

Specific examples of the resin (C) include polymers of hydroxystyrenes such as polymers or copolymers of hydroxystyrene, chlorohydroxystyrene, bromohydroxystyrene, dibromohydroxystyrene and hydroxy-α-methylstyrene, copolymers with other monomers, and modified products of these polymers. Illustrative monomers copolymerizable with the hydroxystyrenes mentioned above include styrene, maleic anhydride, acrylonitrile, acrylic acid, methacrylic acid, ethyl acrylate, butyl acrylate, methyl acrylate, and hydroxyethyl methacrylate. Illustrative modified products of polymers or copolymers of hydroxystyrene include those wherein a hydroxyl group is esterified with an acid anhydride or acid halide (e.g., acetic anhydride, propionyl chloride, pivaloyl chloride, or benzoyl chloride), or etherified with an epoxy compound (e.g., glycidyl butyl ether or glycidyl tolyl ether), or urethanated with an isocyanate compound (e.g., phenyl isocyanate or hexamethylene diisocyanate). Preferably, these modified products contain at least 50 mol% of the unit represented by formula (II). The polymers have a weight average molecular weight of from about 500 to about 50,000, preferably from about 1,000 to about 20,000. These hydroxystyrene polymers can be synthesized by the methods described in *J. Polym. Sci.*, A-1, 7, 2175 (1969), and *Maruzen Sekiyu Gijutsu Hokoku (Maruzen Sekiyu Technical Report)*, 21 1 (1976) or similar methods. Some of these polymers are commercially avaiable.

Specific examples of the resin (B) include phenol/ketone resins; effective polyvalent phenols are resorcinol, catechol and pyrogallol, and effective aliphatic ketones are acetone and methyl ethyl ketone. These polymers have a weight average molecular weight of from about 500 to about 5,000 and can be synthesized by the methods described in *Ind. Eng. Chem.*, 52, 324 (1960) and U.S. Pat. No. 3,635,709 or similar methods. Also effective are modified phenol/ketone resins wherein a hydroxyl group is modified in the same manner as in the case of the aforementioned polymers of hydroxystyrenes. Modified phenol/ketone resins preferably retain about half of the hydroxyl groups contained in the unmodified resins.

The resin (A) include, for example, phenolic novolak resins and cresol resins, and can be synthesized by a well known methods.

Of the resins (A), (B) and (C), resin (A) is particularly preferred.

These resins are contained in the internal latent image type silver halide emulsion in the form of fine particles. To provide the fine particles of the resin, it is dissolved in an organic solvent whose solubility in water is not more than 10 wt% and is then dispersed in a hydrophilic colloid with the aid of an anionic surfactant such as sodium alkylbenzenesulfonate, taurine derivative or Turkey red oil. Illustrative hydrophilic colloids suitable for use in the emulsion layer are polyvinyl pyrrolidone, polyvinyl imidazole, polyvinyl alcohol, polyacrylic acid amide, and copolymers thereof, and gelatin or their derivatives. Particularly preferred are gelatin and their derivatives of the type described in U.S. Pat. Nos. 2,614,928, 2,763,639, 3,118,766, 3,132,945, and Japanese Patent Publication Nos. 5514/64 and 26845/67. These colloids may be used in combination with a high-boiling plasticizer such as tricresyl phosphate, dioctyl butyrate or dodecyl succinic acid ester.

The olephilic resins are preferably dispersed in the hydrophilic colloid as particles having a size of about 0.01 to 10 microns. These resins can be contained in the internal latent image type silver halide emulsion in an amount of from about 0.1 to about 20 parts by weight per 10 parts by weight of the hydrophilic colloid. Preferably, they are present in the emulsion in an amount of about 1 to 10 and more preferably about 2 to 5 parts by weight per 10 parts by weight of hydrophilic colloid.

Suitable supports used in the present invention are aluminum supports having a hydrophilic surface including a plastic or a composite sheet where an aluminum sheet is laminated onto a film. The support is desirably subjected to a surface treatment, for example, a sand graining treatment, dipping in an aqueous solution of sodium silicate, potassium fluorozirconate, phosphates or the like, or anodization.

Additionally, the aluminum plate which is treated by dipping in an aqueous solution of sodium silicate after sand graining as described in U.S. Pat. No. 2,714,066 and an aluminum plate which is firstly anodized and then dipped in an aqueous solution of a silicic acid alkali metal salt as described in U.S. Pat. No. 3,181,461 are preferably used in this invention. The above anodization treatment is carried out by passing a current through an aluminum plate in an aqueous or non-aqueous solution of an inorganic acid, e.g., phosphoric acid, chromic acid, sulfuric acid, boric acid, etc., an organic acid, e.g., oxalic acid, sulfamic acid, etc., or the salt thereof, or in a solution comprising two or more of the foregoing, particularly preferably in an aqueous solution of phosphoric acid or a mixture thereof.

Silicate electric deposition as described in U.S. Pat. No. 3,658,662 is also effective. Moreover, an aluminum plate which is electrolyzed in an electrolyte of hydrochloric acid using an alternating current and then anodized in an electrolyte of sulfuric acid as described in British Pat. No. 1,208,224 is preferred. Furthermore, it is preferred from the standpoint of preventing scum in printing to provide on the aluminum plate anodized as described above an undercoating layer of a cellulose based resin containing a water-soluble salt of a metal, e.g., zinc, etc., as described in U.S. Pat. No. 3,860,426.

A layer containing the water-insoluble, oleophilic resinous material used in the present invention can accept printing ink and thus constitute the image area of printing plate itself. The term "oleophilic resinous material" implies one that exhibits a positive value for $\theta = -[\theta o/w - \theta w/o]$ obtained from the contact angles $\theta w/o$ and $\theta o/w$ measured in accordance with the above. Specific examples of such materials include, for example, shellac, those resins set forth in British Pat. Nos. 1,460,978 and 1,505,739 which comprise hydroxyethyl acrylate or hydroxyethyl methacrylate as a chief recurring unit, polyamide resins such as are shown in U.S. Pat. No. 3,751,257, phenol resins as set forth in British Pat. No. 1,074,392, polyvinyl acetal including polyvinyl butyral, linear polyurethanes as set forth in U.S. Pat. No. 3,660,097, those resins containing an amino moiety such as polyaminostyrene, poly(alkylaminomethacrylate) or poly(alkylaminoacrylate), cellulose derivatives such as cellulose acetate, cellulose alkyl ether, cellulose acetate-phthalate, etc.

Moreover, novolak type phenol resins are preferred, including phenol-formaldehyde resin, o-cresol-formaldehyde resin, m-cresol-formaldehyde resin, etc. More preferably, together with one of these phenol resins, one can use the condensation product of formaldehyde with a phenol or cresol substituted with a $C_3-C_8$ alkyl group exemplified by t-butylphenol-formaldehyde resin.

As the positive type non-silver photosensitive layer capable of giving rise to an oleophilic image, those containing o-quinonediazide compounds are particularly suited.

Particularly preferred o-quinonediazide compounds are o-naphthoquinonediazide compounds, which are described in, for example, U.S. Pat. Nos. 2,766,118, 2,767,092, 2,772,972, 2,859,112, 2,907,665, 3,046,110, 3,046,111, 3,046,115, 3,046,118, 3,046,119, 3,046,120, 3,046,121, 3,046,122, 3,046,123, 3,061,430, 3,102,809, 3,106,465, 3,635,709, and 3,647,443. Many other publications illustrate o-quinonediazide compounds that can be used in this invention with advantage. Particularly preferred are o-naphthoquinonediazidesulfonate ester or o-naphthoquinonediazidecarboxylate ester of aromatic hydroxy compounds as well as o-naphthoquinonediazidesulfonic acid amide or o-naphthoquinonediazidecarboxylic acid amide of aromatic amino compounds. Particularly effective compounds include a condensate of pyrogallol and acetone that is esterified with o-naphthoquinonediazidesulfonic acid as described in U.S. Pat. No. 3,635,709; a polyester having an end hydroxyl group that is esterified with o-naphthoquinonediazidesulfonic acid or o-naphthoquinonediazidecarboxylic acid as described in U.S. Pat. No. 4,028,111, and a homopolymer of p-hydroxystyrene or a copolymer of p-hydroxystyrene and another copolymerizable monomer that is esterified with o-naphthoquinonediazidesulfonic acid or o-naphthoquinonediazidecarboxylic acid as described in British Pat. No. 1,494,043.

These o-quinonediazide compounds may be used independently, but they are preferably used in combination with an alkali-soluble resin. Suitable alkali-soluble resins include phenolic novolak resins such as a phenol-formaldehyde resin, o-cresol-formaldehyde resin and m-cresol-formaldehyde resin. More preferably, as described in U.S. Pat. No. 4,123,279, these phenolic resins are used in combination with a condensate of formaldehyde with a phenol or cresol substituted by an alkyl group of $C_3-C_8$ such as t-butylphenol-formaldehyde resin. The alkali-soluble resin is contained in an amount of from about 50 to about 85%, preferably from 60 to 80%, based on the total weight of the photosensitive resist-forming composition.

The photosensitive composition containing the o-quinonediazide compound may further contain a pigment, dye or plasticizer, as required.

The layer containing an oleophilic resinous material or the posi type non-silver photosensitive layer which gives rise to an oleophilic image explained heretofore should be provided on an aluminum support at a coating rate of about 0.1 to 5 g/m$^2$ on dry base.

Next, the method of preparing a planographic printing plate from the photosensitive planographic plate produced in accordance with the present invention will be described.

First of all, an image exposure is performed with light of such a spectral distribution and/or an intensity that only the internal type, unfogged silver halide emulsion can photographically respond. Such an image exposure can be done by contact or projection exposure with a transparent positive original, or by scanning with a laser beam. Then the exposed plate is subjected to a first development with a surface developer in the presence of a fogging agent. The fogging agent may be present either in the internal type silver halide emulsion coating or in the surface developer; among these two embodiments, the former is preferred whereby the surface developer is free from such a fogging agent. Via this processing, the exposed areas in the internal type silver halide emulsion coating are reduced to give a positive silver image.

Various types of surface developer which are well known to those skilled in the art can be applied to the present invention. Though surface developers should contain substantially no silver halide solvent, use of such a solvent is permitted, however, to improve the stability of the developer (shelf life expansion) provided that the finished developer can give a maximum density not greater than 0.4 in the exposed areas. Additionally, the surface developer desirably does not cause cracking of the silver halide grains, nor promote recrystallization to a substantial degree.

The principal examples of reducing agents for the developer include hydroquinone derivatives, catechols, aminophenols, 3-pyrazolidones, ascorbic acid, redactones, p-phenylenediamines, etc. Such compounds may be used in combination and be present in the photographic material. Suitable compounds include: p-phenylenediamine derivatives; N,N-diethyl-p-phenylenediamine hydrochloride, 2-amino-5-diethylaminotoluene hydrochloride, 2-amino-5-(N-ethyl- N-laurylamino)toluene, 4-[N-ethyl-N-(β-hydroxyethyl)amino]aniline sulfate, 2-methyl-4-[N-ethyl-N-(β-hydroxyethyl)amino]aniline sulfate, N-ethyl-N-(β-methanesulfoaminoethyl)-3-methyl-4-aminoaniline sesquisulfate, monohydrate which is set forth in U.S. Pat. No. 2,193,015, N-(2-amino-5-diethylaminophenylethyl)-methanesulfonamide sulfate set forth in U.S. Pat. No. 2,592,364, N,N-dimethyl-p-phenylenediamine hydrochloride, 4-amino-3-methyl-N-ethyl-N-methoxyethylaniline set forth in U.S. Pat. No. 3,656,950, 4-amino-3-methyl-N-ethyl-N-β-ethoxyethylaniline, 4-amino-3-methyl-N-ethyl-N-β-butoxyethylaniline, etc. The last few compounds may be used also in the form of salt including sulfate, hydrochloride, sulfite, p-toluenesulfonate, etc.

In the developer there can be incorporated an antifoggant or a development suppressing agent, or they may be present in the photosensitive member, if desired. Particularly desirable results are realized when the first development is carried out in the presence of an antifoggant as described in U.S. Pat. No. 2,497,917 typical examples being benzotriazole compounds, benzoimidazole compounds, benzothiazole compounds, heterocyclic thione derivatives, triazole compounds, benzoxazole compounds, pyrrole compounds, etc.

The pH of the developer preferably lies in the range of from about 7 to 15. A relatively wide range of developing temperatures are permitted. Typically it is from about 15° to 40°.

The emulsion coating is fixed immediately after the first development. Where the surface developer functions as a tanning developer, the undeveloped silver halide emulsion can be washed off with warm water instead of fixing.

Where the photosenstive lithographic plate of the invention comprises layer (a) of an oleophilic resinous material, the latter method of development is adapted to provide a resist image, and then the unprotected region of the oleophilic resin-containing layer is eliminated with a suitable solvent to leave the hydrophilic surface of the aluminum support exposed. On the other hand, when layer (a) is a non-silver, positive type photosensitive layer, the silver image formed in the internal type silver halide emulsion coating is used as an optical mask through which radiation active to the underlying non-silver layer is given. Then the plate is processed with a second developer capable of developing the non-silver photosensitive layer whereby the hydrophilic surface of the aluminum support is exposed. In the latter embodiment, one can remove, prior to the second development and after the irradiation with light active to the non-silver layer, the internally sensitized silver halide emulsion coating in its entirety. For the development of a non-silver photosensitive layer comprising an o-quinonediazide compound, the aqueous solution of an alkali metal silicate is recommended. Some typical formulations for such developers are found in German Patent Application (OLS) No. 2,846,256.

Below, there are illustrated some practical examples of the present invention, which is, as a matter of course, not limited thereto. In the examples, all percentages are based on weight unless otherwise designated.

EXAMPLE 1

A 2S grade aluminum sheet mechanically surface grained was immersed in a 2% aqueous sodium hydroxide solution kept at 40° C. for 1 minute to partially etch the surface. After rinsing with water, the sheet was immersed in a mixture of sulfuric acid and chromic acid for about 1 minute whereby a fresh aluminum surface appeared. Then the sheet was subjected to anodizing in a 20% sulfuric acid bath kept at 30° C. with a passage of electric current of 1.5 D.C. volt with a current density of 3 A/dm$^2$ for 2 minutes, and then to water rinse followed by drying. A coating mixture for a non-silver photosensitive layer of the following composition was applied on the sheet by means of roll coater so as to give a dry coating rate of 2 g/m$^2$. The coated sheet was dried at 100° C. for 2 minutes.

| | |
|---|---|
| The naphthoquinone-1,2-diazide (2)-5-sulfonic acid ester of an acetone/pyrogallol resin prepared in accordance with Example 1 of U.S. Pat. No. 3,635,709 | 2.5 g |
| Hitanol #3110 (a cresol/formaldehyde resin, produced by Hitachi Chemical Ind.) | 5.0 g |
| Methyl ethyl ketone | 75 g |
| Cyclohexanone | 60 g |

Next, photosensitive coating mixture (I) of the following composition was applied on the plate in a continuous mode so as to give a coating weight of 5 g/m$^2$ on dry base whereafter drying was performed with hot air at 90° C. as the final step. The resulting sample is Sample No. 1.

45 g of phenol/formaldehyde resin with a commercial designation MP120HH (a product of GUN-EI Chemical Ind., Ltd.) was dissolved in a mixture of 330 g ethyl acetate and 120 g methyl ethyl ketone, to which 20 g of tricresyl phosphate was further dissolved. This solution was emulsified into an aqueous solution comprising 600 ml of an aqueous 10% gelatin solution, 60 ml of an aqueous 10% solution of sodium nonylbenzene sulfonate and 150 ml of a 10% methanol solution of turkey red oil. Using this dispersion, another coating fluid was prepared as follows:

Photosensitive Coating Mixture (I)

| | |
|---|---|
| The dispersion described above | 1,300 g |
| A silver iodobromide crude emulsion (internally sensitized type; containing 45 g gelatin and 0.59 mol of silver iodobromide per 1 kg, the iodide content: 2 mol %, and the average grain size: 1.2 microns) | 2,000 g |
| Potassium iodide 0.5% aqueous solution | 80 ml |
| 2% aqueous solution of 2-methyl-3-(β-hydroxyethyl)benzothiazolium bromide | 40 ml |
| Water | 1,300 g |

Sample No. 1 was converted into a lithographic printing plate by the following procedures. A reflective positive original containing text was projected onto the sample by means of a process camera provided with a light source of 500 lux through a lens with an opening of F-11 for 20 seconds. The plate precursor was then fed into an automatic processor to be processed as follows. First Developer (I) of the following composition was supplied to the processor at a temperature of 32° C. for 60 seconds, then brushing was carried out with the use of 45° C. hot water for 30 minutes to eliminate the non-image areas. A positive image resulted.

Developer (I)

The following two fluids I-a and I-b were mixed just before use in equal volumes to give Developer (I).

Fluid I-a

| | |
|---|---|
| Pyrogallol | 6 g |
| p-Monomethylaminophenol Hemisulfate | 2 g |
| Citric Acid | 2 g |
| Water to make | 1,000 ml |

Fluid I-b

| | |
|---|---|
| Sodium Carbonate (monohydrate) | 225 g |
| Potassium Bromide | 3 g |
| Sodium Hexametaphosphate | 2 g |
| Water to make | 1,000 ml |

Then, the plate precursor was passed through an exposure station installed with three reflector type mercury lamps for 15 seconds, and then processed with Developer (II) of the following composition kept at 30° C. for 30 seconds. Finally, the plate was coated with 14° Bé gum arabic solution to give a finished printing plate.

Developer (II)

| | |
|---|---|
| JIS-1 Grade Sodium Silicate | 10 g |
| Sodium Metasilicate | 5 g |
| Purified Water | 180 ml |

When the plate was subjected to printing with a Heidel GTO printer, printing plates with excellent edge sharpness were obtained.

EXAMPLE 2

On the same aluminum support as described in Example 1, the non-silver photosensitive coating mixture shown in Example 1 was coated to give a coating weight of 2 g/m² after drying.

Photosensitive coating mixture (II) of the following composition was then overcoated in a continuous manner so as to provide a coating rate of 8 g/m² after drying. The resulting plate is designated Sample No. 2.

Photosensitive Coating Mixture (II)

| | |
|---|---|
| A dispersion of an oleophilic phenol/ formaldehyde resin MP120HH (a product of Gun-Ei Chemical Ind.) obtained by dissolving 20 g of said resin together with 20 g dioctyl adipate in a mixture comprising 154 ml ethyl acetate and 56 ml methyl ethyl ketone, which was dispersed under rapid stirring with a homogeneous blender into a mixture comprising 280 g of a 10% gelatin solution, 28 ml of a 10% aqueous solution of sodium dodecylbenzenesulfonate and 70 ml of a 10% methanol solution of turkey red oil | total amount |
| A silver iodobromide crude emulsion (internally sensitized type; containing 55 g gelatin and 0.6 mol of silver iodobromide per 1 kg emulsion, the iodide content: 2 mol %, and the average grain size: 1.2 microns) | 1,000 g |
| Potassium iodide 0.5% aqueous solution | 20 ml |
| A 0.15% methanol solution of 3-ethyl-5-[2-(1-ethyl-4-methyltetrazolidine-ethylydine]-2-thioxo-4-oxazolydine-one | 65 ml |
| A 0.5% aqueous solution of 4-hidroxy-6-methyl-1,3,3a,7-tetrazaindene | 21 ml |
| A 2% aqueous solution of 2,4-dichloro-6-hydroxy-s-triazine | 35 ml |

Sample No. 2 was converted into a lithographic printing plate via the following procedures. A reflective positive original containing text was projected onto the sample by means of a process camera provided with two 500 lux lamps with a lens aperture of F-22 for about 30 seconds. The plate was then fed into an automatic processor and processed as follows. First Developer (III) of the following composition was supplied to the processor at a temperature of 30° C. for 20 seconds, and then Fixing Solution (I) shown below was fed at room temperature for 10 seconds.

Developer (III)

| | |
|---|---|
| Water | 700 ml |
| Hydroquinone | 10 g |
| Sodium Sulfite | 30 g |
| 4-Methyl-1-phenyl-3-pyrazolidone | 1 g |
| Sodium Orthophosphate | 40 g |
| Sodium Hydroxide | 10 g |
| p-Tolylhydrazine | 0.2 g |
| 5-Nitrobenzotriazole | 0.02 g |
| Water to make | 1,000 ml |

Fixing Solution (I)

| | |
|---|---|
| Water | 700 ml |
| Ammonium Thiosulfate | 224 g |
| Sodium Sulfite | 20 g |
| Water to make | 1,000 ml |

Then the plate was passed through an exposure station installed with three reflector type mercury lamps for 15 seconds, and then processed with Developer II set forth in Example 1 at 30° C. for 30 seconds. Finally, the plate was coated with 14° Bé gum arabic solution to give a finished printing plate.

The plate was set up in a Heidel KOR printer for printing, giving high-quality prints of 100,000, free of smudge and with sharp edges.

Separately, the silver iodobromide crude emulsion used in the example was coated on a cellulose triacetate film support to give a coating thickness of 3 microns. Image exposure was performed in strictly the same manner as set forth above, and one exposed piece was developed with the internal developer Y described hereinbefore, and another piece with the surface developer X described hereinbefore at 20° C. for 6 minutes. The both pieces were fixed for 5 minutes. While $D_{max}$ obtained by developer Y was 2.3, that obtained by developer X at the same exposure amount was only 0.15. From these results, the crude emulsion used was confirmed to be of the internally sensitized type.

EXAMPLE 3

A 2S grade aluminum sheet mechanically surface grained was immersed in a 2% aqueous sodium hydroxide solution kept at 40° C. for 1 minute to etch the surface fractionally. After rinsing with water, the sheet was immersed in a mixture of sulfuric acid and chromic acid for about 1 minute whereby a fresh and clean aluminum surface was exposed. Then, the sheet was subjected to anodizing in a 20% sulfuric acid bath kept at 30° C. with a passage of 1.5 volt D.C. electric current with current density of 3 A/dm² for 2 minutes. After water rinse, the sheet was immersed in a 10% phosphoric acid solution for 30 seconds at 50° C., followed by another water rinse and immersion in a 2% sodium silicate (JIS 3 grade) solution kept at 70° C. for 2 minutes. After water rinse, the sheet was heated for drying. The dried sheet, after cooled to room temperature, was coated with the following subbing fluid by a roll coater.

Subbing Fluid

| Carboxymethyl Cellulose | 2.5 g |
|---|---|
| Nickel Acetate | 2.5 g |
| Water | 1,000 ml |

After rinsing with water and drying, an oleophilic resin layer was provided by coating Vilon 300 (a commercial product available from Toyobo Co., a saturated polyester resin) dissolved in methyl ethyl ketone to give a dried coating rate of about 1 g/m². On this coating, Photosensitive Coating Mixture (I) used in Example 1 was overcoated and dried to give a coating weight of 6 g/m² on a dry base. The finished member is designated Sample No. 3. According to the method described in Example 1, the member was imagewise exposed. The member was developed with Developer (I) at 32° C. for 60 seconds, subjected to a washing-off operation for the non-image areas performed at 40° C. for 30 minutes to give rise to a positive image. After drying, a 15% aqueous solution of Demol EP (a product of Kao Soap Co.) was spread over the entire surface of the sheet with the aid of a piece of absorbent cotton, and the sheet surface was lightly rubbed for about 30 seconds to remove the Vilon 300 layer at the non-image areas. Finally, the sheet was coated with Gum GN-3 made by Fuji Photo Film Co. to provide a printing master. When this master was set up in a Hamade 900 CDX printer and printed, 20,000 prints were possible.

While the invention has been described in detail and with reference to specific embodiments thereof, it will be apparent to one skilled in the art that various changes and modifications can be made therein without departing from the spirit and scope thereof.

What is claimed is:

1. A method of preparing a planographic printing plate utilizing a photosensitive lithographic printing plate precursor comprising an aluminum support having a hydrophilic surface, (a) a positive type non-silver photosensitive layer capable of providing an oleophilic image and (b) a photographic silver halide emulsion layer, said emulsion being unfogged and internally sensitized type, containing a fogging agent and free from any tanning developing agent, the two coatings (a) and (b) being superimposed on the support in order, said method comprising imagewise exposing said photosensitive planographic printing plate, processing said silver halide emulsion with a surface developer free from a fogging agent to obtain a corresponding silver image, irradiating said positive type non-silver photosensitive layer through said silver image with light active to said non-silver photosensitive layer, and finally removing the irradiated portion of said positive type non-silver photosensitive layer to expose the hydrophilic surface of said underlying aluminum support.

2. The process of claim 1, wherein said positive type non-silver photosensitive layer comprises an o-quinonediazide compound and a phelolic novolak resin.

3. The method of claim 1, wherein said photographic silver halide emulsion layer contains a finely divided oleophilic resinous material.

4. The method of claim 1, wherein said internally sensitized silver halide emulsion contains a chemically sensitized silver halide grain covered with an unsensitized silver halide.

5. The method of claim 1, wherein said internally sensitized silver halide emulsion contains silver halide grains having a deactivating sensitizing nuclei at the grain surface.

6. The method of claim 1, wherein said internally sensitized silver halide emulsion is an emulsion which provides an image having a maximum density $D_{max}$ by internal developer Y exceeding that obtained by surface developer X in the specification by a factor of 2 or more, or the photographic speed realized by internal developer Y is at least 5 times as great as that realized with surface developer X.

7. The method of claim 3, wherein said oleophilic resinous material is selected from the group consisting of shellac, polyamide resins, phenolic resins, polyvinyl acetal resins, linear polyurethane resins, phenolic novolak resins and polyester resins.

8. The process of claim 2, wherein said fogging agent is present in an amount of about 100 mg to about 1,500 mg per mol of silver in the silver halide emulsion.

9. The process of claim 8, wherein said fogging agent is selected from the group consisting of 2-methyl-3-{3-(p-sulfophenylhydrazine)propyl}benzothiazolium bromide, 2-methyl-3-(β-hydroxyethyl)benzothiazolium bromide, p-methanesulfonamide-ethylphenylhydrazine, 1,2-dihydro-3-methyl-4-phenylpyrido{2,1-b}benzothiazolium bromide and 3-(2-acetylethyl)-2-benzylbenzoselenazolium bromide.

10. The process of claim 2, wherein said silver halide emulsion layer containing silver image is removed prior to the step of said removing the irradiated portion of the positive type non-silver photosensitive layer and after the step of said irradiation.

* * * * *